(12) United States Patent
Mitchell et al.

(10) Patent No.: US 8,398,776 B2
(45) Date of Patent: Mar. 19, 2013

(54) METHOD AND APPARATUS FOR SUPPORTING WORKPIECES IN A COATING APPARATUS

(75) Inventors: Daniel B. Mitchell, Port McNicoll (CA); Anthony A. Light, Midland (CA); Mark A. Handerek, Midland (CA); Geoffrey G. Harris, Midland (CA); Douglas J. Brown, Midland (CA)

(73) Assignee: Raytheon Canada Limited, Ottawa, Ontario (CA)

( * ) Notice: Subject to any disclaimer, the term of this patent is extended or adjusted under 35 U.S.C. 154(b) by 725 days.

(21) Appl. No.: 12/118,907

(22) Filed: May 12, 2008

(65) Prior Publication Data

US 2009/0280244 A1 Nov. 12, 2009

(51) Int. Cl.
*C23C 16/00* (2006.01)
(52) U.S. Cl. ........................ 118/729; 118/500
(58) Field of Classification Search ............. 118/729, 118/719, 500
See application file for complete search history.

(56) References Cited

U.S. PATENT DOCUMENTS

| | | | |
|---|---|---|---|
| 2,410,720 A | 11/1946 | Dimmick | |
| 2,411,715 A | 11/1946 | Dimmick | |
| 3,314,395 A | 4/1967 | Hemmer | |
| 3,486,237 A | 12/1969 | Sawicki | |
| 3,645,771 A | 2/1972 | Ward | |
| 3,858,547 A | 1/1975 | Bergfelt | |
| 4,600,390 A * | 7/1986 | Gobel et al. | 433/218 |
| 4,817,559 A | 4/1989 | Ciparisso | |
| 4,854,704 A * | 8/1989 | Funazaki et al. | 356/250 |
| 4,868,003 A | 9/1989 | Temple et al. | |
| 4,982,696 A | 1/1991 | Kinoshita et al. | |
| 5,074,246 A | 12/1991 | Gailliard et al. | |
| 5,164,228 A * | 11/1992 | Peralta et al. | 427/164 |
| 5,200,010 A * | 4/1993 | Funami et al. | 156/154 |
| 6,051,113 A | 4/2000 | Moslehi | |
| 6,473,247 B1 * | 10/2002 | Keller et al. | 359/819 |
| 6,632,285 B2 | 10/2003 | Wang et al. | |
| 6,786,176 B2 | 9/2004 | Lee et al. | |
| 7,062,348 B1 | 6/2006 | Folta | |
| 7,122,223 B1 | 10/2006 | Comble et al. | |
| 7,513,949 B2 | 4/2009 | Yamazaki et al. | |
| 7,696,065 B2 * | 4/2010 | Sato et al. | 438/458 |
| 8,246,748 B2 | 8/2012 | Mitchell et al. | |
| 8,293,017 B2 | 10/2012 | Mitchell et al. | |
| 2001/0005553 A1 | 6/2001 | Witzman et al. | |

(Continued)

FOREIGN PATENT DOCUMENTS

JP 2003-071650 * 3/2003

OTHER PUBLICATIONS

English translation of JP 2003-071650, Shimizu, Mar. 2003.*

*Primary Examiner* — Keath Chen
(74) *Attorney, Agent, or Firm* — Lando & Anastasi, LLP

(57) ABSTRACT

One aspect involves: supporting a workpiece with workpiece support structure that includes spaced support parts, a support section supporting the support parts, and a workpiece holding adhesive on each support part, where the adhesives engage respective regions of a surface portion on the workpiece; and supplying a coating material toward a different surface portion of the workpiece. A different aspect involves: supporting a workpiece with workpiece support structure that includes a workpiece support member with a surface portion extending approximately parallel to a direction, and a workpiece support part having two adhesive portions that respectively engage the surface portion on the support member and a surface portion on the workpiece; and supplying a coating material in the direction, toward a different surface portion of the workpiece.

18 Claims, 3 Drawing Sheets

U.S. PATENT DOCUMENTS

| | | |
|---|---|---|
| 2002/0003086 A1 | 1/2002 | Sferlazzo |
| 2002/0005347 A1 | 1/2002 | Sferlazzo et al. |
| 2002/0110648 A1 | 8/2002 | Lee et al. |
| 2002/0110698 A1 | 8/2002 | Singh |
| 2002/0162740 A1 | 11/2002 | Wang et al. |
| 2003/0072881 A1 | 4/2003 | Yang et al. |
| 2003/0077403 A1 | 4/2003 | Darolia et al. |
| 2003/0082300 A1 | 5/2003 | Todd et al. |
| 2004/0231594 A1 | 11/2004 | Edwards et al. |
| 2004/0264352 A1* | 12/2004 | Ohya ............... 369/112.23 |
| 2005/0254148 A1* | 11/2005 | Shimizu ............... 359/819 |
| 2006/0130760 A1 | 6/2006 | Zultzke et al. |
| 2007/0155295 A1 | 7/2007 | Igarashi et al. |
| 2007/0157883 A1 | 7/2007 | Zultzke et al. |
| 2009/0025814 A1 | 1/2009 | Olsson |
| 2009/0186159 A1 | 7/2009 | Mitchell et al. |
| 2009/0258151 A1 | 10/2009 | Mitchell et al. |
| 2011/0020623 A1 | 1/2011 | Mitchell et al. |

* cited by examiner

METHOD AND APPARATUS FOR SUPPORTING WORKPIECES IN A COATING APPARATUS

FIELD OF THE INVENTION

This invention relates in general to coating techniques and, more particularly, to techniques for supporting workpieces during a coating process.

BACKGROUND

When fabricating optical components such as lenses, it is very common to form a coating on an optical surface of the component, where the coating provides desired optical or physical properties. For example, the coating may provide an anti-reflective (AR) characteristic, a filtering characteristic, physical protection for the component, some other characteristic, or a combination of two or more characteristics. These coatings often include multiple layers of different materials that collectively provide the desired characteristic(s).

It is often desirable that a coating completely cover an optical surface that is being coated. However, as discussed in more detail later, conventional workpiece support fixtures often support a workpiece in a manner that obstructs at least part of a peripheral portion of the optical surface, and these covered regions do not end up being coated. Consequently, although conventional support fixtures have been generally adequate for their intended purposes, they have not been entirely satisfactory in all respects.

BRIEF DESCRIPTION OF THE DRAWINGS

A better understanding of the present invention will be realized from the detailed description that follows, taken in conjunction with the accompanying drawing, in which.

DETAILED DESCRIPTION

Figure 1:
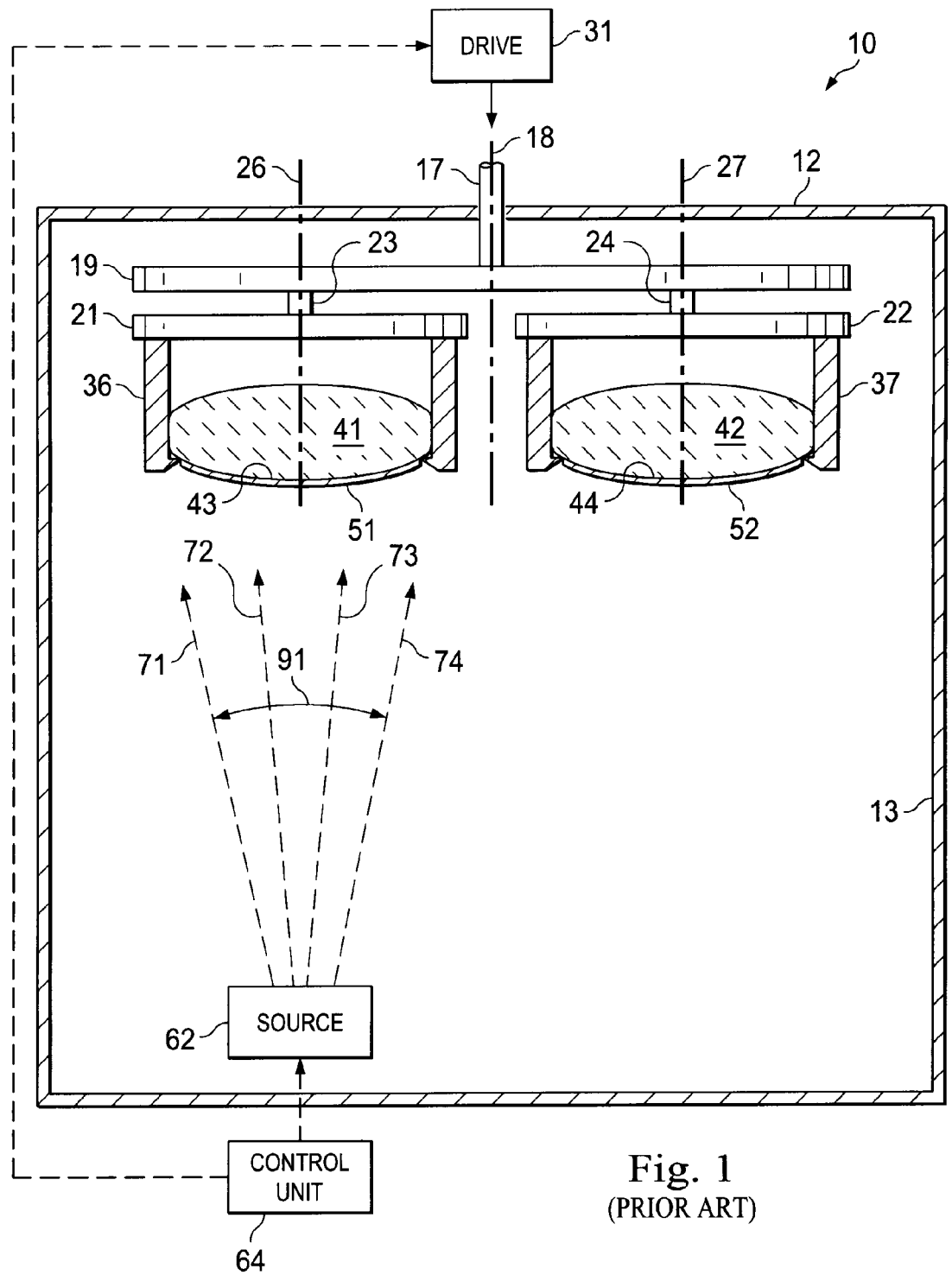
FIG. 1 is diagrammatic sectional side view of a conventional coating apparatus, having conventional support fixtures that support conventional workpieces.

FIG. 1 is diagrammatic sectional side view of a conventional coating apparatus 10. The coating apparatus 10 includes a housing 12 with a chamber 13 therein. During a typical coating operation, a vacuum is maintained in the chamber 13 by a not-illustrated vacuum pump. The housing 12 supports a primary axle 17 for rotation about a primary vertical axis 18. A support part 19 is supported on the axle 17 within the chamber 13 for rotation with the axle about the axis 18. In the disclosed embodiment, the support 19 is disk-shaped, but it could alternatively have any other suitable shape.

The support part 19 rotatably supports two workpiece support members 21 and 22. More specifically, two additional vertical axles 23 and 24 are rotatably supported on the support part 19. These additional axles are spaced circumferentially from each other about the primary axle 17, and each rotate about a respective additional vertical axis 26 or 27. The two support members 21 and 22 are each supported on a respective one of the axles 23 and 24 for rotation therewith about the associated axis 26 or 27. In the disclosed embodiment, the support members 21 and 22 are disk-shaped, but they could each alternatively have any other suitable shape. Although FIG. 1 shows two workpiece support members 21 and 22, with respective axles 23 and 24, it would alternatively be possible to have one or more additional workpiece support members with respective axles, where the axles for all workpiece support members are spaced circumferentially from each other about the primary axle 17.

A drive mechanism 31 such as an electric motor is coupled to the axle 17, in order to effect rotation of the axle 17 and the support part 19. A not-illustrated planetary gearing mechanism of a well-known type is provided and, in response to rotation of the support part 19 with respect to the housing 12, effects rotation of the additional axles 23 and 24 with respect to the support part 19. Thus, the workpiece support numbers 21 and 22 each undergo planetary movement about the primary axis 18 with respect to the housing 12. Each of the workpiece support members 21 and 22 has thereon a respective workpiece support fixture 36 or 37. The workpiece support fixtures 36 and 37 will be described in more detail later. The primary axle 17, the support part 19, the additional axles 23 and 24, the workpiece support members 21 and 22, and the workpiece support fixtures 36 and 37 collectively serve as a workpiece support mechanism. For simplicity and clarity, FIG. 1 shows each of the workpiece support members 21 and 22 with just one workpiece support fixture 36 or 37 thereon. However, it would alternatively be possible for each of the workpiece support members 21 and 22 to have a plurality of workpiece support fixtures thereon.

Each of the workpiece support fixtures 36 and 37 is configured to removably support a respective workpiece 41 or 42. The workpieces 41 and 42 each have a surface 43 or 44 on a lower side thereof. The apparatus 10 is used to form respective coatings 51 and 52 on the surfaces 43 and 44 of the workpieces 41 and 42, in a manner discussed later. In the disclosed embodiment, the workpieces 41 and 42 with the coatings 51 and 52 are each an optical component of a well-known type, such as a lens. Therefore, they are described here only briefly, to the extent necessary to facilitate an understanding of various aspects of the present invention. Further, it should be understood that the coating apparatus 10 is not limited to use for coating optical components, but instead can be used for coating any of a wide variety of other types of workpieces.

It would be possible for each of the coatings 51 and 52 to be only a single layer of a single material. But in the disclosed embodiment, the coatings 51 and 52 each happen to include a plurality of different layers, involving the use of one material for some layers, another material for other layers, and so forth. By interleaving different layers of different materials in a known manner, the coatings 51 and 52 can each be given certain desired optical characteristics. For example, the coatings 51 and 52 may each provide an anti-reflective (AR)

characteristic that causes little or no reflection of a selected range of wavelengths, such as a range corresponding to visible light.

In some cases, the multi-layer coatings 51 and 52 will be configured in a known manner to provide a combination of two or more desired optical characteristics. For example, a given coating might provide an anti-reflection characteristic as to one range of wavelengths, such as visible light, while also filtering out wavelengths in a different range of wavelengths, such as a range associated with laser energy.

As another example, if the optical workpiece 41 or 42 happens to be made of a relatively soft material that was selected because it provides certain desirable optical properties, the coating 51 or 52 may be configured to be physically harder than the associated workpiece 41 or 42, in order to help physically protect the material of the workpiece 41 or 42. Thus, a given coating 51 or 52 may provide an anti-reflection characteristic, while also being physically harder than the material of the associated workpiece 41 or 42, in order to help physically protect the workpiece. The discussion here of anti-reflection characteristics, filtering characteristics and hardness characteristics is merely exemplary. The coatings 51 and 52 may each provide some or all of these characteristics, and/or any of a variety of other characteristics, separately or in combination.

The coating apparatus 10 includes a source 62 within the housing 12, in a lower portion of the chamber 13. The source 62 is spaced downwardly from the support part 19. The source 62 and the drive mechanism 31 are both controlled by a control unit 64 of a known type. Although FIG. 1 shows only a single source 62, it would alternatively be possible to provide two or more sources in the apparatus 10. In the disclosed embodiment, the source 62 is spaced radially from the primary axis 18, and is positioned approximately below the path of travel of the workpiece support members 21 and 22. However, it would alternatively be possible for the source 62 to be positioned at any of a variety of other locations within the housing 12.

The source 62 is a device of a type well known in the art, and is therefore described here only briefly. In the disclosed embodiment, the source 62 is a type of device commonly referred to as an electron beam evaporator. However, the source 62 could alternatively be any other suitable type of device. The source 62 contains two or more different materials that will be used to form respective layers in each of the multi-layer coatings 51 and 52, and the source can selectively evaporate any of these different materials. At any given point in time, the source 62 will typically be evaporating only one of the multiple materials that it contains. But in some situations, the source may simultaneously evaporate two or more of these different materials.

When the source 62 is evaporating a material, a plume of the evaporated material travels upwardly, as indicated diagrammatically by arrows 71-74. The plume 71-74 has a dispersion angle 91. The plume 71-74 from the source 62 coats the surfaces 43 and 44 on the workpieces 41 and 42 as the workpieces pass above the source 62.

Figure 2:
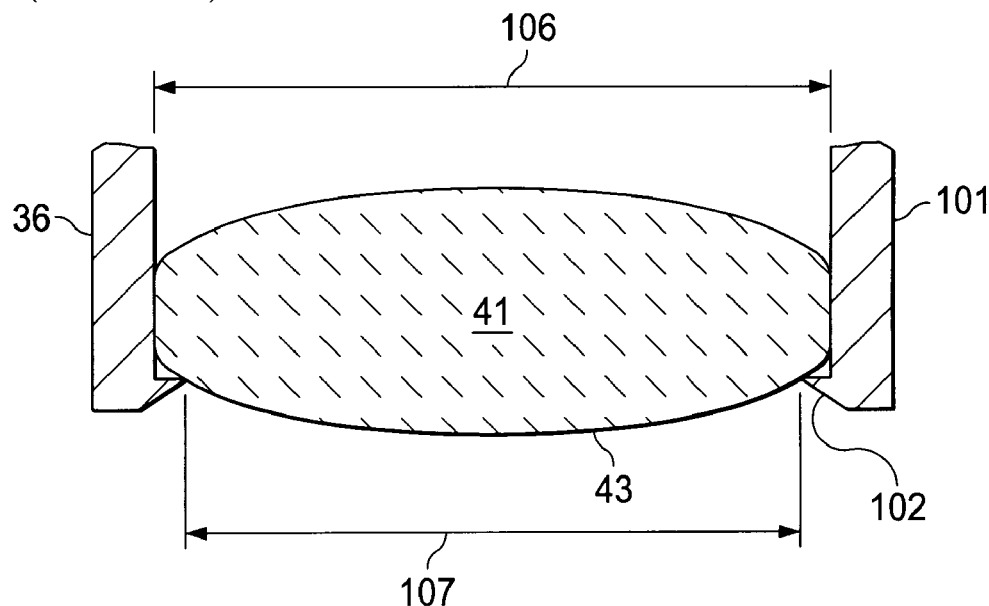
FIG. 2 is a diagrammatic fragmentary sectional side view of a workpiece and a workpiece support fixture from the apparatus of FIG. 1.

FIG. 2 is a diagrammatic fragmentary sectional side view of the workpiece support fixture 36 and the workpiece 41 of FIG. 1, where the workpiece is shown without the coating 51. The workpiece support fixture 36 includes a cylindrical annular sleeve 101, with an inwardly-projecting annular flange 102 at its lower end. Although the sleeve 101 and flange 102 in the disclosed embodiment are cylindrical, they could alternatively have any other suitable shape, for example in dependence on the shape of the particular workpiece that is to be supported. In FIG. 2, the surface 43 on the lower side of the workpiece 41 has a diameter 106, and the circular opening through the flange 102 has an inner diameter 107, which is less that the diameter 106. It is desirable that the apparatus 10 form a coating that covers the entire surface 43, such that the coating also has a diameter 106. However, the flange 102 obstructs the peripheral edge of the surface 43, and prevents it from being coated. Thus, with reference to FIGS. 1 and 2, the coating 51 ends up covering only part of the surface 43, and having a diameter 107.

Figure 3:
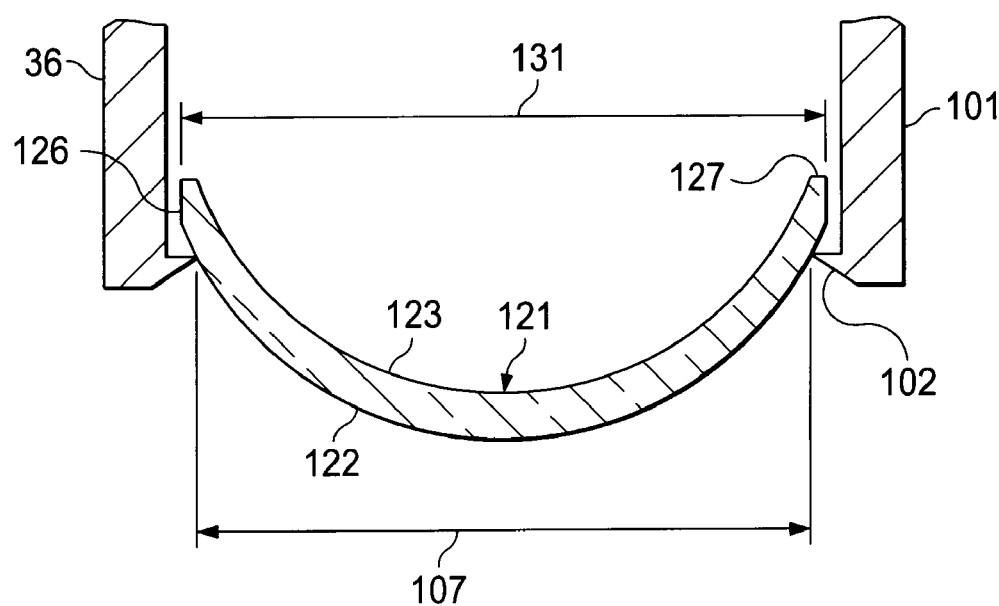
FIG. 3 is a diagrammatic fragmentary sectional side view similar to FIG. 2, but showing a different conventional workpiece supported by the workpiece support fixture.

FIG. 3 is a diagrammatic fragmentary sectional side view similar to FIG. 2, but showing a different conventional workpiece 121 that is also an optical lens. The lens 121 has a highly curved convex surface 122 on one side thereof, and a highly curved concave surface 123 on the other side thereof. As a result, the workpiece 121 is relatively thin. The workpiece 121 has an annular, outwardly-facing cylindrical side surface 126 adjacent a peripheral edge of the surface 122. In addition, the workpiece 121 has an annular, planar edge surface 127 that faces approximately upwardly in FIG. 3.

As discussed above, the flange 102 on the workpiece support fixture 36 has an inside diameter 107. The workpiece surface 122 that is to be coated has a diameter 131 that is greater than the diameter 107. Consequently, when a coating is formed on the surface 122, the coating has a diameter 107, and does not cover the peripheral edges of the surface 122.

In the case of the lens or workpiece 121, there is a further consideration. As noted above, the workpiece 121 is relatively thin. The material of the workpiece 121 may have a coefficient of thermal expansion (CTE) that is different from the CTE of the workpiece support fixture 36. If the interior of the chamber 13 is heated during a coating operation, the workpiece 121 may expand faster than the fixture 36, causing compressive forces to be exerted on the workpiece 121 by the fixture 36, and thereby causing the workpiece 121 to shatter. Similarly, if the interior of the chamber 13 is cooled during a coating operation, and if the fixture 36 contracts more rapidly than the workpiece 121, the fixture 36 may exert compressive forces on the workpiece 121 that cause it to shatter.

Figure 4:
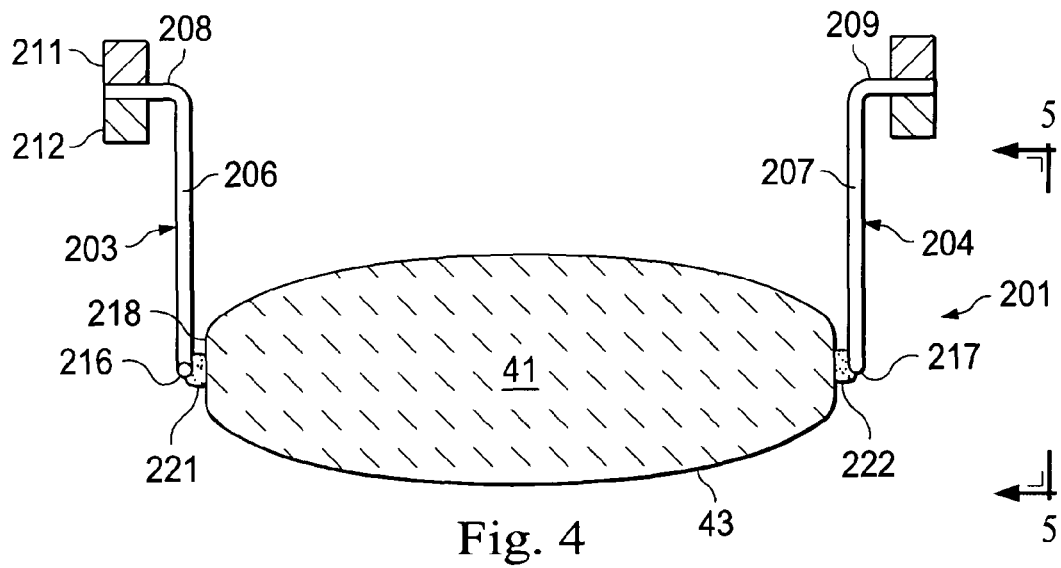
FIG. 4 is a diagrammatic side view, partly in section, showing a workpiece support fixture that embodies aspects of the invention, and that can be used in place of the conventional workpiece support fixture of FIGS. 1 and 2, and also showing a workpiece supported in the fixture.

FIG. 4 is a diagrammatic side view, partly in section, showing the workpiece 41 and a workpiece support fixture 201, where the workpiece support fixture 201 embodies aspects of the present invention, and can be used in place of the workpiece support fixture 36 of FIGS. 1 and 2. The workpiece support fixture 201 includes several support wires, two of which are visible at 203 and 204 in FIG. 4. In the disclosed embodiment, the support wires 203-204 are identical, each have a degree of flexibility, and are each made of metal. However, they could alternatively be made of any other suitable material.

The support wires are provided at circumferentially spaced locations about the workpiece 41. Each has a vertical central portion 206 or 207, and an upper end portion 208 or 209 that is bent to extend horizontally outwardly at a right angle to the associated central portion 206 or 207. The workpiece support fixture 201 includes a clamping mechanism having two annular clamping elements 211 and 212 that are capable of a small amount of relative vertical movement. The upper end portions 208 and 209 of the wires 203 and 204 are each removably clamped between the clamping elements 211 and 212.

Figure 5:
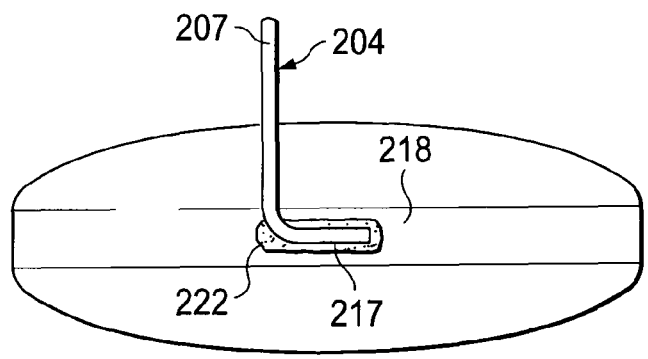
FIG. 5 is a diagrammatic fragmentary side view of a portion of the apparatus of FIG. 4.

The support wires 203 and 204 each also have a lower end portion 216 or 217 that is bent to extend at approximately a right angle to the associated central portion 206 or 207, and approximately parallel to an outwardly-facing cylindrical side surface 218 of the workpiece 41. In this regard, FIG. 5 is a diagrammatic fragmentary side view of a portion of the apparatus shown in FIG. 4, and depicts the lower end portion 217 of the wire 204 and a portion of the side surface 218 on the workpiece 41. A bead of workpiece adhesive 221 or 222 is provided between the side surface 218 of workpiece 41, and the lower end portion 216 or 217 of a respective wire 203 or 204. The workpiece adhesives 221 and 222 are vacuum-compatible, and each bond the workpiece side surface 218 to the lower end portion 216 or 217 of a respective wire 203 or 204. In the disclosed embodiment, the adhesive used at 221 and 222 is a product that is commercially available under the registered trademark VACSEAL®, for example as catalog part number 05049-AB from Structure Probe, Inc. (SPI® Supplies) of West Chester, Pa. However, it would alternatively be possible to use any other suitable adhesive.

With reference to FIGS. 4 and 5, it will be noted that the workpiece support fixture 201 cooperates with the side surface 218 of the workpiece 41, and does not obstruct any portion of the surface 43 that is to be coated. Consequently, the entire surface 43 will be coated by the apparatus 10. In addition, as mentioned above, the wires 203 and 204 each have a degree of flexibility. Consequently, if the chamber 13 is heated and/or cooled during the coating process, such that the workpiece 41 expands and/or contracts, the wires 203 and 204 will flex slightly to absorb the expansion and/or contraction, without exerting any force on the workpiece that would be sufficient to shatter the workpiece.

Although FIGS. 4 and 5 depict the workpiece support fixture 201 with the workpiece 41 supported therein, the fixture can alternatively support any of a variety of other workpieces, including but not limited to the workpiece 121 shown in FIG. 3. For the workpiece 121, the workpiece adhesives 221 and 222 could adhesively engage either the side surface 126 or the edge surface 127.

Figure 6:
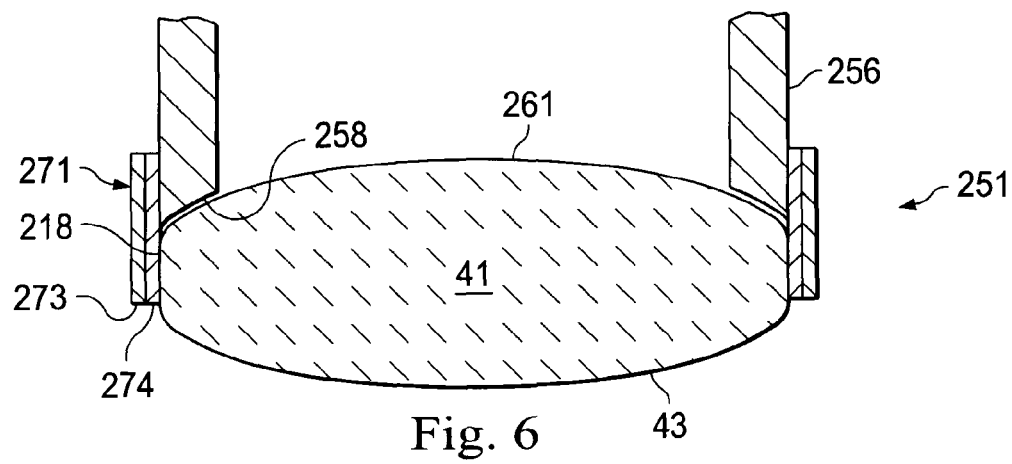
FIG. 6 is a diagrammatic fragmentary sectional side view, showing a further embodiment of a workpiece support fixture that embodies aspects of the invention, and that can be used in place of the conventional workpiece support fixture of FIGS. 1 and 2, and also showing a workpiece supported in the fixture.

FIG. 6 is a diagrammatic fragmentary sectional side view of the workpiece 41, and a workpiece support fixture 251 that embodies aspects of the invention, and that can be used in place of the fixture 36 of FIG. 1. The fixture 251 includes an annular cylindrical support member 256, with an outside diameter that is approximately equal to the outside diameter of the cylindrical side surface 218 of the workpiece 41. Alternatively, if the workpiece had a side surface that was not cylindrical, the support member 256 could be configured so that its exterior surface conformed to the shape of the side surface on the workpiece. At its lower end, the support member 256 has a downwardly-facing annular end surface 258, which is faces and is adjacent a top surface 261 of the workpiece 41, and which is curved to match the curvature of the workpiece top surface 261.

The workpiece support fixture 251 also includes a piece of flexible, vacuum-compatible tape 271 that extends around both the workpiece 41 and the lower end of the support member 256, in engagement with each. The tape includes an elongate flexible strip or carrier 273, with an adhesive layer 274 on the inner side thereof. The lower portion of the adhesive layer 274 engages the side surface 218 on the workpiece 41, and the upper portion of the adhesive layer engages the lower portion of the outwardly facing side surface on the support member 256. In the disclosed embodiment, the tape 271 is a product obtained commercially under the trademark KAPTON® from C.S. Hyde Company, Inc. of Lake Villa, Ill. KAPTON® tape is commercially available in a variety of widths and with a variety of different levels of adhesion, and the particular tape selected for use at 271 will depend on factors such as the size and weight of the particular workpiece that is to be supported. Although the disclosed embodiment uses KAPTON® tape, it would alternatively be possible to use any other suitable part.

Although FIG. 6 depicts the workpiece support fixture 251 with the workpiece 41 supported therein, the workpiece support fixture 251 is capable of supporting a wide variety of other types of workpieces, including but not limited to the workpiece shown at 121 in FIG. 3. In the case of the workpiece 121, the lower portion of the adhesive layer 274 on the tape 271 would engage the side surface 126 of the workpiece 121.

It will be noted from FIG. 6 that, since the tape 271 engages the side surface 218 of the workpiece 41, the surface 43 that is to be coated remains completely unobstructed. Thus, when the workpiece support fixture 251 is used, the apparatus 10 can form a coating that covers the entire surface 43, including its peripheral edges. In addition, since the tape 271 is flexible, if the chamber 13 is heated and/or cooled during the coating process, such that the workpiece fixture 251 and/or the workpiece expands and/or contracts, the tape 271 will flex in order to accommodate differences in the rates of expansion and/or contraction of these parts. Consequently, the workpiece support fixture 251 will not exert any forces on the workpiece that would tend to cause the workpiece to shatter.

Although a selected embodiment has been illustrated and described in detail, it should be understood that a variety of substitutions and alterations are possible without departing from the spirit and scope of the present invention, as defined by the claims that follow.

What is claimed is:

1. An apparatus comprising:
   a workpiece support structure that includes a plurality of spaced support parts, a support section that supports each of said support parts, and a workpiece holding adhesive disposed on each said support part at a location thereon spaced from said support section; and
   a coating structure that can selectively supply a coating material toward said workpiece support structure,
   wherein each said support part includes an elongate piece of wire having a first end portion supported by said support section, a second end portion remote from said first end portion and approximately parallel to an outwardly-facing cylindrical side surface of a workpiece, and a central portion extending between said first end portion and said second end portion, said first end portion and said second end portion each extending transversely from said central portion, each said workpiece holding adhesive being at a length side of said second end portion of a respective said elongate piece of wire.

2. An apparatus according to claim 1, wherein said support section includes a clamping structure that releasably grips said first end portion of each said elongate piece of wire.

3. An apparatus according to claim 1, including a workpiece supported by said workpiece support structure and having first and second surface portions that are mutually exclusive, said first surface portion facing toward said coating structure, and said second surface portion having two spaced regions that are each engaged by said workpiece holding adhesive on a respective said support part.

4. An apparatus according to claim 3, wherein said second surface portion faces outwardly and is annular.

5. An apparatus according to claim 3, wherein said workpiece is an optical component, said first surface portion is an optical surface, and said first surface portion has thereon an optical coating that includes a layer of coating material from said coating structure.

6. An apparatus according to claim 1, wherein said first end portion of said elongate piece of wire extends at a right angle to said central portion of said elongate piece of wire.

7. An apparatus according to claim 6, wherein said first end portion extends along a first axis and said second end portion extends along a second axis transverse to the first axis.

8. An apparatus according to claim 1, wherein said central portion and said second end portion of said elongate piece of wire together have an L shape.

9. An apparatus according to claim 1, wherein said first end portion and said second end portion of said elongate piece of wire extend at right angles with respect to said central portion of said elongate piece of wire.

10. An apparatus according to claim 1, further comprising a workpiece supported by said workpiece support structure and having a first coating surface and a second support surface, said first coating surface and said second support surface being mutually exclusive;
   wherein said coating structure is configured to selectively supply said coating material toward said first coating surface; and
   wherein said workpiece holding adhesive engages said second support surface.

11. An apparatus according to claim 10, wherein said plurality of spaced support parts are circumferentially spaced around said second support surface of said workpiece.

12. An apparatus comprising:
   a workpiece support structure including a plurality of spaced apart workpiece support members; and
   a coating structure that can selectively supply a coating material in a direction toward said workpiece support structure;
   each said workpiece support member including:
      an elongate wire having an upper horizontal end portion, a lower horizontal end portion and a vertical central portion extending between said upper end portion and said lower end portion; wherein the lower horizontal end portion is approximately parallel to an outwardly-facing cylindrical side surface of a workpiece and
      a workpiece holding adhesive disposed on said lower end portion of said elongate wire.

13. An apparatus according to claim 12, wherein said workpiece support structure includes a clamping element configured to releasably grip said upper end portion of each of said plurality of workpiece support members.

14. An apparatus according to claim 12, wherein said upper end portion of said elongate wire extends along a first axis and said lower end portion of said elongate wire extends along a second axis transverse to the first axis.

15. An apparatus according to claim 12, wherein said lower end portion of said elongate wire extends at a first right angle with respect to said central portion of said elongate wire.

16. An apparatus according to claim 15, wherein said upper end portion of said elongate wire extends at a second right angle with respect to said central portion of said elongate wire.

17. An apparatus according to claim 12, further comprising a workpiece supported by said workpiece support structure and having a first coating surface and a second support surface, said first coating surface and aid second support surface being mutually exclusive;
   wherein said coating structure is configured to selectively supply said coating material toward said first coating surface; and
   wherein said workpiece holding adhesive engages said second support surface.

18. An apparatus according to claim 17, wherein said plurality of spaced apart support members are circumferentially spaced around said second support surface of said workpiece.

* * * * *